United States Patent
Byun et al.

(10) Patent No.: US 7,706,181 B2
(45) Date of Patent: Apr. 27, 2010

(54) MULTI-BIT PROGRAMMING DEVICE AND METHOD USING SINGLE-BIT MEMORY CELLS

(75) Inventors: Sung-Jae Byun, Yongin-si (KR); Dong Hyuk Chae, Seoul (KR); Kyoung Lae Cho, Yongin-si (KR); Jun Jin Kong, Yongin-si (KR); Young Hwan Lee, Suwon-si (KR); Seung Jae Lee, Hwaseong-si (KR); Nam Phil Jo, Seoul (KR); Dong Ku Kang, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 228 days.

(21) Appl. No.: 11/896,349

(22) Filed: Aug. 31, 2007

(65) Prior Publication Data

US 2008/0273405 A1    Nov. 6, 2008

(30) Foreign Application Priority Data

May 2, 2007    (KR) ...................... 10-2007-0042764

(51) Int. Cl.
*G11C 11/34* (2006.01)
*G11C 16/04* (2006.01)
(52) U.S. Cl. ............................ 365/185.03; 365/185.22; 365/185.09; 365/200; 711/162
(58) Field of Classification Search ............ 365/185.03, 365/185.09, 185.22, 189.2, 228; 711/162, 711/165
See application file for complete search history.

(56) References Cited

U.S. PATENT DOCUMENTS

| 5,946,233 | A | 8/1999 | Kim et al. |
| 6,456,528 | B1* | 9/2002 | Chen ..................... 365/185.03 |
| 7,038,950 | B1 | 5/2006 | Hamilton et al. |
| 7,275,140 | B2* | 9/2007 | Paley ......................... 711/159 |
| 7,420,847 | B2* | 9/2008 | Li ......................... 365/185.22 |
| 2007/0025151 | A1 | 2/2007 | Lee |
| 2008/0074928 | A1* | 3/2008 | Choi ..................... 365/185.17 |
| 2008/0094893 | A1* | 4/2008 | Choi ..................... 365/185.03 |
| 2008/0162789 | A1* | 7/2008 | Choi et al. .................. 711/103 |

FOREIGN PATENT DOCUMENTS

| KR | 10-2008-0027419 | 3/2008 |
| KR | 10-2008-0035353 | 4/2008 |

OTHER PUBLICATIONS

Notice of Allowance for corresponding Korean Application No. 10-2007-0042764 dated Nov. 28, 2008.
International Search Report dated Apr. 11, 2008.

* cited by examiner

*Primary Examiner*—Tuan T Nguyen
*Assistant Examiner*—R Lance Reidlinger
(74) *Attorney, Agent, or Firm*—Harness, Dickey & Pierce, P.L.C.

(57) ABSTRACT

A multi-bit programming device and method for a non-volatile memory are provided. In one example embodiment, a multi-bit programming device may include a multi-bit programming unit configured to multi-bit program original multi-bit data to a target memory cell in a memory cell array, and a backup programming unit configured to select backup memory cells in the memory cell array with respect to each bit of the original multi-bit data, and program each bit of the original multi-bit data to a respective one of the selected backup memory cells.

16 Claims, 6 Drawing Sheets

MULTI-BIT PROGRAMMING DEVICE AND METHOD USING SINGLE-BIT MEMORY CELLS

PRIORITY CLAIM

A claim of priority is made to Korean Patent Application No. 10-2007-0042764, filed on May 2, 2007, in the Korean Intellectual Property Office, the disclosure of which is incorporated herein by reference.

BACKGROUND

1. Field

Example embodiments of the present invention may relate to a semiconductor memory device, and more particularly, to a multi-bit programming device and a method of multi-bit programming.

2. Description of Related Art

A non-volatile memory (NVM) device is a type of memory, which can electrically program and erase, and maintain programmed data even when power is not supplied thereto.

NVM devices are widely used for digital cameras, cellular phones, personal data assistants (PDAs), laptop computers, and the like. Also, an NVM device is capable of storing a large amount of data in a relatively small package.

In general, an NVM device programs and erases data by changing a threshold voltage of a transistor in a memory cell array. This method is known as a Fowler-Nordheim tunneling (F-N tunneling).

A programming method of storing at least two data bits in a single memory cell is widely used to reduce a size of a semiconductor chip. Such a method is embodied by varying a threshold voltage of a transistor included in a memory cell array by several different gradations. A memory cell array storing data using such a programming method is known as a multi-level cell (MLC).

However, one gradation of the threshold voltage of a transistor should be smaller in comparison with existing single-level programming methods. Accordingly, controlling a gradation of a threshold voltage of a transistor is difficult.

Also, for program data requiring high reliability, e.g., operating systems, firmware, and the like, a multi-bit programming method to prevent generation of errors while programming is required. Accordingly, a more efficient multi-bit programming method in an NVM device may be required.

SUMMARY

Example embodiments of present invention may provide a multi-bit programming device and method which may reduce an error generated while. The example embodiments may also provide a multi-bit programming device and method where data loss does not occur when programming is interrupted.

In an example embodiment of the present invention, a multi-bit programming device may include a multi-bit programming unit configured to multi-bit program original multi-bit data to a target memory cell in a memory cell array, and a backup programming unit configured to select backup memory cells in the memory cell array with respect to each bit of the original multi-bit data, and program each bit of the original multi-bit data to a respective one of the selected backup memory cells.

In another example embodiment of the present invention, a method of multi-bit programming may include multi-bit programming original multi-bit data to a target memory cell in a memory cell array, and selecting backup memory cells in the memory cell array with respect to each bit of the original multi-bit data, and programming each bit of the original multi-bit data to a respective one of the selected backup memory cells.

BRIEF DESCRIPTION OF THE DRAWINGS

The above and other aspects of example embodiments of the present invention may become apparent and more readily appreciated from the following detailed description, taken in conjunction with the accompanying drawings of which.

DETAILED DESCRIPTION OF EXAMPLE EMBODIMENTS

Reference will now be made in detail to example embodiments of the present invention, examples of which are illustrated in the accompanying drawings, wherein like reference numerals refer to the like elements throughout.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
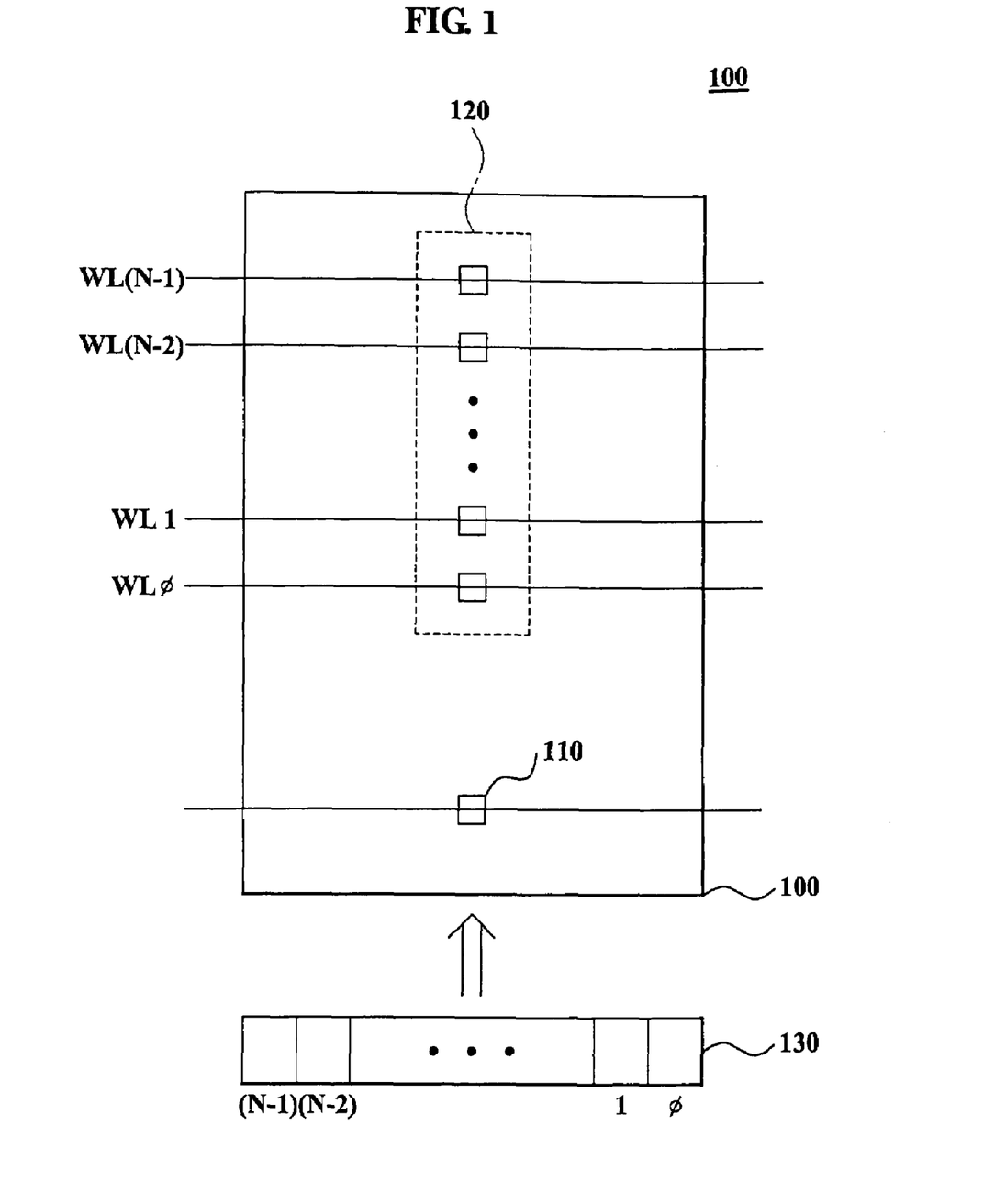
FIG. 1 is a circuit diagram illustrating a multi-bit programming device according to an example embodiment of the present invention.

FIG. 1 is a circuit diagram illustrating a multi-bit programming device according to an example embodiment of the present invention.

Referring to FIG. 1, a multi-bit programming device 100 may multi-bit program original N-bit data 130 to a target memory cell 110. The multi-bit programming device 100 may include a nonvolatile memory (NVM) cell array.

The multi-bit programming device 100 may select backup memory cells 120 with respect to each bit of the original N-bit data 130. The multi-bit programming device 100 may enable each of the selected backup memory cells 120 and connect it to a word line, which may be different from a word line of the target memory cell 110. A number of the selected backup memory cells 120 may be N.

The multi-bit programming device 100 may back up data, e.g., back up the original N-bit data 130 to the N number of selected backup memory cells 120. The multi-bit programming device 100 may program only one-bit data per a single backup memory cell 120.

The multi-bit programming device 100 may read and compare the multi-bit programmed N-bit data at the target memory cell 110 with the N number of selected backup memory cells 120. Based on the comparison, the multi-bit programming device 100 may verify whether a multi-bit programming has been successful.

A successful multi-bit programming may occur when the N-bit data read out from the N number of selected backup memory cells 120 and the N-bit data-read out from the target memory cell 110 are identical. Accordingly, if the N-bit data read out from the N number of selected backup memory cells 120 and the N-bit data read out from the target memory cell 110 are identical, the multi-bit programming device 100 may erase the N number of selected backup memory cells 120, and prepare for a subsequent operation. The N number of selected backup memory cells 120 may temporarily store the original data, and thus the N number of selected backup memory cells 120 may function as temporary memory cells.

Figure 2:
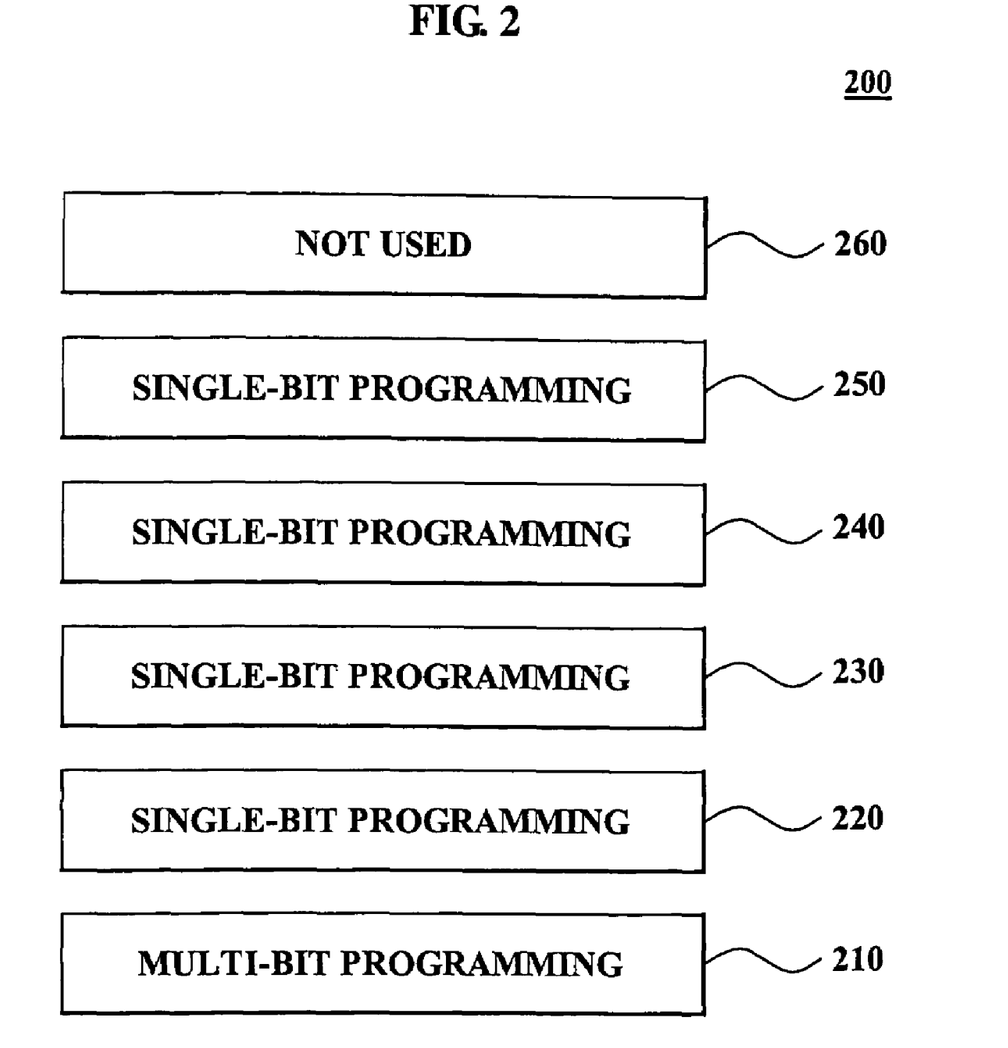
FIG. 2 is a diagram illustrating a status of a multi-bit programming operation according to an example embodiment of the present invention.

FIG. 2 is a diagram of a memory cell array illustrating a status of a multi-bit programming operation according to an example embodiment of the present invention. Referring to FIG. 2, a memory cell array 200 applying a multi-bit programming operation may include six memory cell array blocks 210, 220, 230, 240, 250, and 260. The memory cell array 200 may include an NVM cell array. Target memory cells may be included in a first memory cell array block 210. Original four-bit data may be multi-bit programmed to each of the target memory cells.

Backup memory cells may be respectively included in a second block 220, a third block 230, a fourth block 240, and a fifth block 250. One-bit data of the original four-bit data may be programmed to each of the backup memory cells, e.g., in the first, second, third, and fourth blocks 220, 230, 240, 250. One-bit data programmed to a single memory cell is referred to as single-bit programming.

When the original four-bit data is multi-bit programmed to each of the target memory cells, a number of the backup memory cells may be four times the number of the target memory cells. Four backup memory cell array blocks may be required when multi-bit programming the original four-bit data to a single memory cell array block, which is referred to as a minimum preservation block.

The multi-bit programming device may program each bit of the original four-bit data to each of the selected backup memory cells, and multi-bit program each bit of the programmed original four-bit data to the target memory cell.

Generally, programming data to a memory cell array requires more time than reading data. Accordingly, when programming the data to the memory cell array, a method where data corresponding to each of a predetermined number of memory cells may be simultaneously programmed to each of the predetermined number of memory cells may be used. The predetermined number is greater than 1.

The memory cells simultaneously programmed may be referred to as a single page. Data programmed to the single page may be maintained by latching the data via a page buffer during programming. The single page may include memory cells connected to a single word line.

When the single page includes an M number of memory cells, a data-programming operation may be simultaneously performed on a target page including an M number of the target memory cells. When a four-bit programming operation is performed on the target page, the original four-bit data may become 4M-bit. A four-bit programming operation may correspond to performing a target page programming operation four times. The target page programming operation may successively program each M-bit data of the original 4M-bit data to the target page.

The target page programming operation may change a threshold voltage of the target memory cells depending on data to be programmed. The four-bit programming operation may be performed by varying an amount of threshold voltage for each target page programming operation, which may be performed four times. Each of the target memory cells may have $16(=2^4)$ threshold voltages. Each of the $16(=2^4)$ threshold voltages may respectively have a different level.

The multi-bit programming device may perform a backup programming operation. The backup programming operation may simultaneously program M-bit data to a backup page including the M number of backup memory cells. When the four-bit programming operation is performed on the target page, four backup pages may be required, and the backup programming operation may be required to be performed four times.

A single backup page of the four backup pages may be selected for each of the memory cell array blocks 220, 230, 240, and 250. Also, all of the four backup pages may be selected in a single block of the memory cell array blocks 220, 230, 240, and 250.

The multi-bit programming device 200 may perform a first backup programming operation with respect to first M-bit data of the original 4M-bit data, and thereby may program the first M-bit data to a first backup page. Also, the multi-bit programming device 200 may perform a first target page programming operation, and thereby may program the first M-bit data to the target page.

Also, the multi-bit programming device 200 may perform a second backup programming operation with respect to second M-bit data of the original 4M-bit data, and thereby may program the second M-bit data to a second backup page. The multi-bit programming device 200 may perform a second target page programming operation, and thereby may program the second M-bit data to the target page. The first target page programming operation and the second target page programming operation may program data, which may be different from each other, to the same target page by varying an amount of threshold voltage of the target memory cell.

Similarly, a third backup programming operation, a third target page programming operation, a fourth backup programming operation, and a fourth target page programming operation may be performed in a similar manner as described above.

The first target page programming operation, the second target page programming operation, the third target page programming operation, and the fourth target page programming operation may be included in the four-bit programming operation by varying an amount of threshold voltage.

Figure 3:
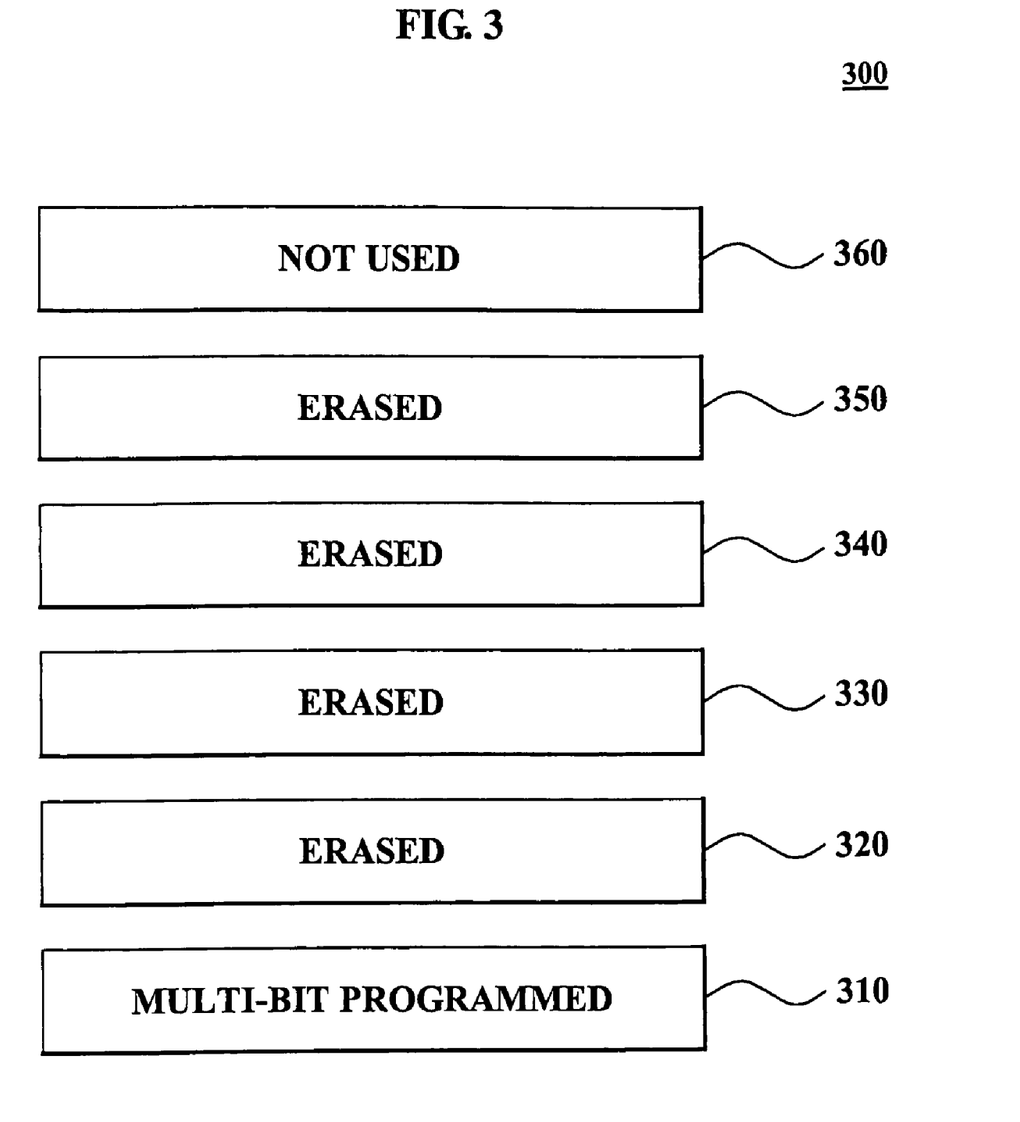
FIG. 3 is a diagram illustrating a status of a multi-bit programming operation according to another example embodiment of the present invention.

FIG. 3 is a diagram of a memory cell array illustrating a status of a multi-bit programming operation according to another example embodiment of the present invention.

Referring to FIG. 3, a memory cell array 300 capable of a multi-bit programming operation may include six memory cell array blocks 310, 320, 330, 340, 350, and 360. The memory cell array 300 may include an NVM cell array.

A first block 310 may indicate a status where four-bit data is multi-bit programmed to memory cells included therein.

A second block 320, a third block 330, a fourth block 340, and a fifth block 350 may indicate a status where backup data programmed to memory cells are erased. The memory cell array 300 may be ready to perform a subsequent operation after completing the erasing operation.

Figure 4:
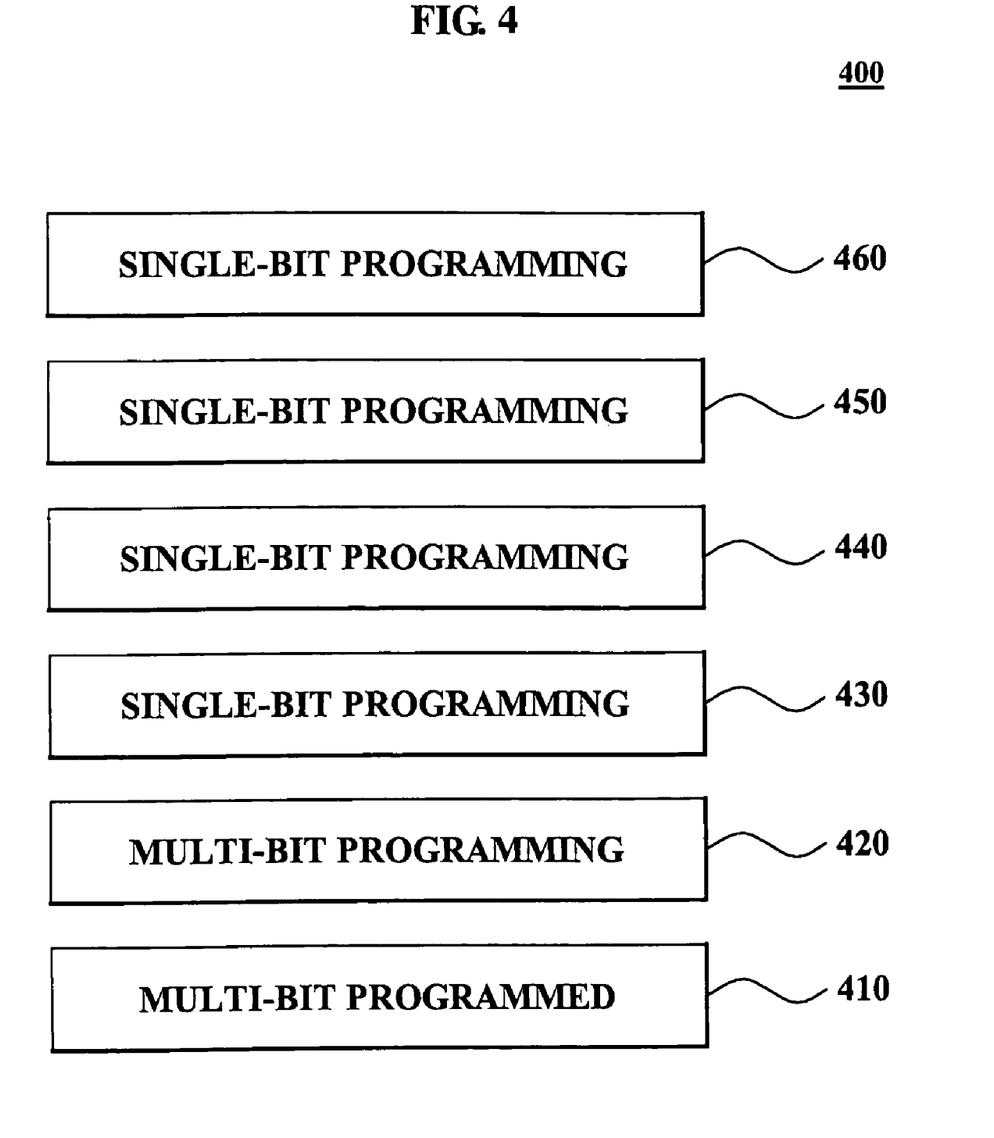
FIG. 4 is a diagram illustrating a status of a multi-bit programming operation according to still another example embodiment of the present invention.

FIG. 4 is a diagram illustrating a status of a multi-bit programming operation according to still another example embodiment of the present invention.

Referring to FIG. 4, a memory cell array 400 where the multi-bit programming operation may be applied include six memory cell array blocks 410, 420, 430, 440, 450, and 460. The memory cell array 400 may be an NVM cell array.

A first block 410 may indicate a status where four-bit data is multi-bit programmed to memory cells included therein.

Memory cells included in a second block 420 may be target memory cells, and original four-bit data may be multi-bit programmed to each of the target memory cells.

A third block 430, a fourth block 440, a fifth block 450, and a sixth block 460 may include backup memory cells. One-bit data of the original four-bit data may be programmed to each of backup memory cells. The third block 430, the fourth block 440, the fifth block 450, and the sixth block 460 may be a minimum preservation block.

Figure 5:
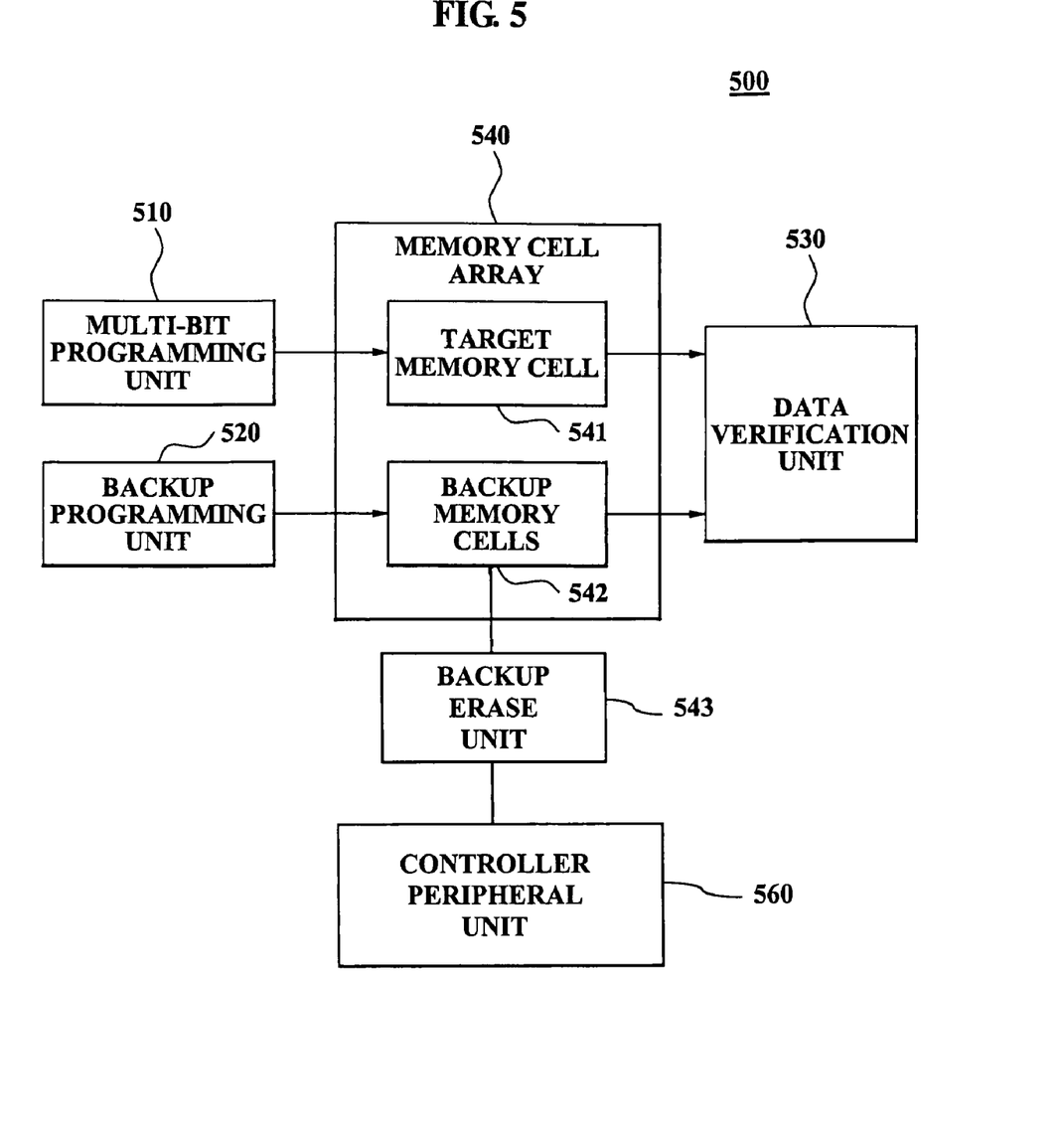
FIG. 5 is a block diagram illustrating a configuration of a multi-bit programming device according to an example embodiment of the present invention.

FIG. 5 is a block diagram illustrating a configuration of a multi-bit programming device according to an example embodiment of the present invention.

Referring to FIG. 5, the multi-bit programming device 500 may include a multi-bit programming unit 510, a backup programming unit 520, a data verification unit 530, and a memory cell array 540. The memory cell array 540 may be an NVM cell array.

The multi-bit programming unit 510 may multi-bit program original multi-bit data to a target memory cell 541 in the memory cell array 540. The multi-bit programming unit 510 may program each bit of the original multi-bit data by varying an amount of threshold voltage of the target memory cell 541.

The backup programming unit 520 may select backup memory cells 542 in the memory cell array 540 with respect to each bit of the original multi-bit data, and program each bit of the original multi-bit data to each of the selected backup memory cells 542. The backup programming unit 520 may program only one-bit data per a single backup memory cell.

When original data is N-bit data and a multi-bit programming unit N-bit programs the original data to a target memory cell 541, an N number of backup memory cells 542 may be required.

Referring again to FIG. 5, each of the backup memory cells 542 may be selected to be connected to a word line different from a word line of the target memory cell 541, and connected to a word line different from word lines of other selected backup memory cells 542.

The backup memory cells 542 may be selected based on a number of times each of the memory cells in the memory cell array 540 is used.

A degradation of cell characteristics may occur in a single memory cell as programming and erasing operations are repeated over time. When the degradation of the cell characteristics occur, the memory cell may no longer be used. When a particular memory cell is repeatedly used and becomes unusable, the entire memory cell array 540 may no longer be used even though usable memory cells still remain.

In example embodiments, each of the memory cells in the memory cell array 540 may be equally used by selecting the backup memory cells 542 based on the number of times each of all the memory cells in the memory cell array 540 have been used, thereby extending the lifetime of the memory cell array 540. The above-described operation is known as wear-leveling, and the wear-leveling may be performed via a controller/peripheral circuit 560 connected to the memory cell array 540.

After programming each bit of the original multi-bit data to each of the selected backup memory cell 542, the multi-bit programming device 500 may multi-bit program each bit of the programmed original multi-bit data to the target memory cell 541.

Multi-bit programming the N-bit data to the target memory cell 541 may correspond to programming one-bit data to the target memory cell 541 an N number of times. Also, after each bit of the original data is programmed to each of the backup memory cells 542, the same data may be programmed to the target memory cell 541, which may be repeated an N number of times.

Referring again to FIG. 5, the data verification unit 530 may verify whether the multi-bit programming is successful by comparing the multi-bit programmed data in the target memory cell 541 with the programmed data in the selected backup memory cells 542.

A successful multi-bit programming may correspond to when the N-bit data programmed to the N number of selected backup memory cells 542 and the N-bit data multi-bit programmed to the target memory cell 541 are identical.

Referring again to FIG. 5, the multi-bit programming unit 510, the backup programming unit 520, and the data verification unit 530 may be embodied via a peripheral circuit/controller 560 connected to the memory cell array 540 and provided outside of the memory cell array 540.

According to another example embodiment of the present invention, the multi-bit programming device 500 may further include a backup erase unit 543. The backup erase unit 543 may erase the selected backup memory cells 542 when the data verification unit 530 determines that the multi-bit programmed data to the target memory cell 541 and the programmed data to the selected backup memory cells 542 are identical. The multi-bit programming device 500 may be ready to perform a subsequent operation after the selected backup memory cells 542 are erased by the backup erase unit 543.

The original data used in the multi-bit programming device 500 may be meta-data operating a memory device including the memory cell array 540. Generally, address information and functional information with respect to another data is referred to as meta-data. In a memory device, functional information of each memory cell array block, and the like, may be stored in a particular block, which may be used to operate the memory device.

The meta-data may be considered firmware or an operation system. When a function of a memory device requires an upgrade, the meta-data may be updated.

When the updating is not completed because of an external variable, for example, power is turned off while updating the meta-data, the meta-data may become corrupt, and the memory device may become unusable. The multi-bit programming device 500 according to example embodiments of present invention may provide high reliability with respect to manipulation of data.

Figure 6:
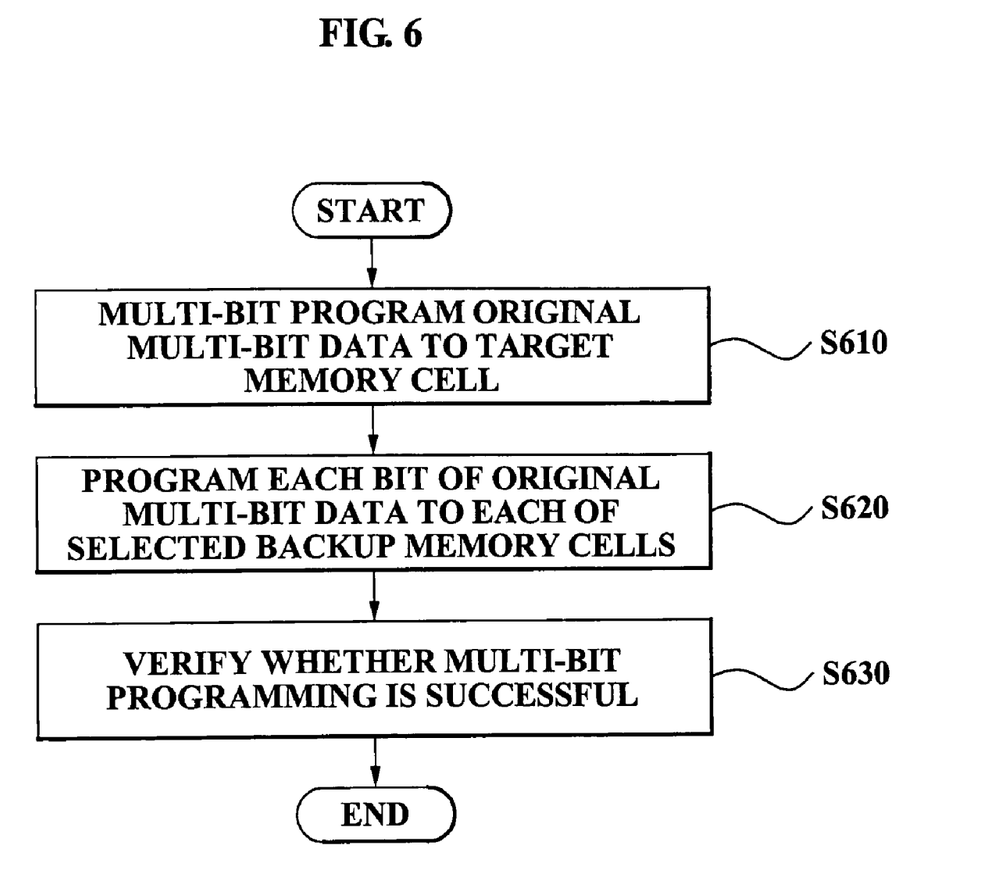
FIG. 6 is a flowchart illustrating a multi-bit programming method according to an example embodiment of the present invention.

FIG. 6 is a flowchart illustrating a multi-bit programming method according to an example embodiment of the present invention.

Referring to FIG. 6, a multi-bit programming method according to an example embodiment of the present invention may multi-bit program original multi-bit data to a target memory cell in a memory cell array in step S610. The multi-bit programming of the original multi-bit data in step S610 may program each bit of the original multi-bit data by varying an amount of threshold voltage of the target memory cell.

The multi-bit programming method may select backup memory cells in the memory cell array with respect to each bit of the original multi-bit data, and program each bit of the original multi-bit data to each of the selected backup memory cells in step S620. Here, only one-bit data per a single backup memory cell of the selected backup memory cells may be programmed. Each of the backup memory cells may be selected and connected to a word line different from a word line of the target memory cell, and connected to a word line different from word lines of other selected backup memory cells.

The backup memory cells may be selected based on a number of times all of the memory cells in the memory cell array are used. An operation described above may enable all of the memory cells in the memory call array to be equally used, and may enable a lifetime of the memory cell array to be extended.

After programming each bit of the original multi-bit data to each of the selected backup memory cells, each bit of the programmed original multi-bit data may be multi-bit programmed to the target memory cell.

When the original multi-bit data is N-bit data, the multi-bit programming the N-bit data to the target memory cell may correspond to programming one-bit data to the target memory call an N number of times.

The multi-bit programming method may verify whether the multi-bit programming is successful by comparing the multi-bit programmed data to the target memory cell with the programmed data to the selected backup memory cells in step S630. The multi-bit programming may be successful when the N-bit data programmed to the N number of selected backup memory cells and the N-bit data multi-bit programmed to the target memory cell are identical.

According to another example embodiment of the present invention, a multi-bit programming method may further include an operation of erasing the selected backup memory cells when the multi-bit programmed data to the target memory cell and the programmed data to the selected backup memory cells are identical as a result of the verification. The memory cell array may be ready to perform a subsequent operation by erasing the selected backup memory cells.

The above-described example embodiments of the present invention may be recorded in a computer-readable media including program instructions to implement various operations embodied by a computer. The media may also include, alone or in combination with the program instructions, data files, data structures, and the like. The media and program instructions may be those specially designed and constructed for the purposes the example embodiment of the present invention, or they may be of the kind well-known and available to those having skill in the computer software arts. Examples of computer-readable media include magnetic media such as hard disks, floppy disks, and magnetic tape, optical media, for example, CD ROM disks and DVD, magneto-optical media, for example, optical disks, and hardware devices that may be specially configured to store and perform program instructions, for example, read-only memory (ROM), random access memory (RAM), flash memory, and the like. The media may also be a transmission medium such as optical or metallic lines, wave guides, etc. including a carrier wave transmitting signals specifying the program instructions, data structures, etc. Examples of program instructions include both machine code, for example, produced by a compiler, and files containing higher level code that may be executed by the computer using an interpreter. The described hardware devices may be configured to act as one or more software modules in order to perform the operations of the above-described example embodiments of the present invention.

According to the example embodiment of the present invention, a multi-bit programming device and method may reduce an error generated while programming without enlarging a size of a semiconductor chip.

Also, according to the example embodiments of the present invention, in a multi-bit programming device and method, a data loss may not occur when programming is interrupted.

Although example embodiments have been shown and described, the example embodiments of the present invention is not limited to the described example embodiments. Instead, it would be appreciated by those skilled in the art that changes may be made to these example embodiments.

What is claimed is:

1. A multi-bit programming device, the device comprising:
   a multi-bit programming unit configured to multi-bit program original multi-bit data to a target memory cell in a memory cell array;
   a backup programming unit configured to select backup memory cells in the memory cell array with respect to each bit of the original multi-bit data, and program each bit of the original multi-bit data to a respective one of the selected backup memory cells; and
   a data verification unit configured to verify whether the multi-bit programming is successful by comparing the multi-bit programmed data in the target memory cell with the programmed data in the selected backup memory cells,
   wherein the backup programming unit is configured to program only one-bit data per a single backup memory cell of the selected backup memory cells.

2. The device of claim 1, wherein the memory cell array comprises:
   at least two memory cell array blocks, wherein at least one of the at two memory cell array blocks includes the target memory cell, and the other one of the at least two memory cell array blocks includes at least one of the selected backup memory cells.

3. The device of claim 1, further comprising:
   a backup erase unit configured to erase the selected backup memory cells.

4. The device of claim 1, wherein each of the backup memory cells is selectively connected to a word line different from a word line of the target memory cell and different with respect to each other.

5. The device of claim 1, further comprising:
   one of a controller and a peripheral circuit connected to the memory cell array, and configured to select the backup memory cells based on number of times each of the memory cells in the memory cell array have been used.

6. The device of claim 1, wherein the multi-bit programming unit is configured to program each bit of the original multi-bit data by varying a voltage of the target memory cell.

7. The device of claim 1, wherein the multi-bit programming unit is configured to multi-bit program each bit of the original multi-bit data to the target memory cell when the backup programming unit programs each bit of the original multi-bit data to the respective one of the selected backup memory cells.

8. The device of claim 1, wherein the memory cell array comprises a non-volatile memory (NVM) cell array.

9. The device of claim 8, wherein the multi-bit programming device is included in an NVM device.

10. The device of claim 9, wherein the original multi-bit data comprises meta-data.

11. A method of multi-bit programming, the method comprising:
    multi-bit programming original multi-bit data to a target memory cell in a memory cell array;
    selecting backup memory cells in the memory cell array with respect to each bit of the original multi-bit data, and programming each bit of the original multi-bit data to a respective one of the selected backup memory cells; and
    verifying whether the multi-bit programming is successful by comparing the multi-bit programmed data to the target memory cell with the programmed data to the selected backup memory cells,
    wherein only one-bit data per a single backup memory cell of the selected backup memory cells is programmed.

12. The method of claim 11, further comprising:
    erasing the selected backup memory cells when the multi-bit programmed data to the target memory cell and the programmed data to the selected backup memory cells are identical as a result of the verification.

13. The method of claim 11, wherein the backup memory cells are selected based on number of times all of the memory cells in the memory cell array are used.

14. The method of claim 11, wherein the multi-bit programming of the original multi-bit data programs each bit of the original multi-bit data by varying a threshold voltage of the target memory cell.

15. The method of claim 11, further comprising:
    multi-bit programming each bit of the programmed original multi-bit data to another target memory cell.

16. The method of claim 11, wherein the multi-bit programming is implemented in a computer-readable recording medium.

* * * * *